United States Patent [19]
Wu

[11] Patent Number: 6,063,706
[45] Date of Patent: *May 16, 2000

[54] METHOD TO SIMULATANEOUSLY FABRICATE THE SELF-ALIGNED SILICIDED DEVICES AND ESD PROTECTIVE DEVICES

[75] Inventor: Shye-Lin Wu, Hsinchu, Taiwan

[73] Assignee: Texas Instruments—Acer Incorporated, Hsinchu, Taiwan

[ * ] Notice: This patent is subject to a terminal disclaimer.

[21] Appl. No.: 09/014,864

[22] Filed: Jan. 28, 1998

[51] Int. Cl.$^7$ .................................................. H01L 21/44
[52] U.S. Cl. ........................................... 438/682; 306/197
[58] Field of Search ..................................... 438/200, 682, 438/275, 197, 299, 306, 649

[56] References Cited

U.S. PATENT DOCUMENTS

| | | | |
|---|---|---|---|
| 5,262,344 | 11/1993 | Mistry | 438/200 |
| 5,920,774 | 7/1999 | Wu | 438/224 |

OTHER PUBLICATIONS

Bin–Shing Chen et al., Formation of Cobalt Silicided Shallow Junction Using IMplant Into/Through Silicide Technology and Low Temperature Furnace Annealing, IEEE Transactions on Electron Devices, vol. 43, No. 2, Feb. 1996, pp. 258–266.

Kueing–Long Chen, Effects of Interconnect Process and Snapback Voltage on the ESD Failure Threshold of NMOS Transistors, 1988 EOS/ESD Symposium Proceedings, pp. 212–219.

Ajith Amerasekera et al., Correlating Drain Junction Scaling, Salicide Thickness, and Lateral NPN Behavior, with the ESD/EOS Performance of a 0.25 $\mu$m CMOS Process, 1996 IEEE, pp. 893–896.

P. Fornara et al., Modeling of Local Reduction in TiSi$_2$ Growth Near Spacers in MOS Technologies: Influence of Mechanical Stress and Main Diffusing Species, 1996 IEEE, pp. 73–76.

*Primary Examiner*—Tuan H. Nguyen
*Attorney, Agent, or Firm*—Harness, Dickey & Pierce, P.L.C.

[57] ABSTRACT

A method to simultaneously fabricate the self-aligned silicided devices and electrostatic discharge devices is disclosed. A substrate is provided, a functional region and an electrostatic discharge region are defined on the substrate, gates of the regions are formed, lightly doping drain is formed in the substrate, a pad silicon nitride is formed on the electrostatic discharge region, spacers of the functional region is formed, a refractory metal is deposited or sputtered on the functional region, a two-step salicide process is performed on the substrate and a salicide layer is formed on the surface of the functional region, a high-energy implantation is performed on the substrate to form the active regions of the functional device and the electrostatic discharge device, a thick field oxide is formed on the surface of the substrate and a rapid thermal processing anneal is performed on the substrate to form an ultra-shallow junction of the functional devices.

13 Claims, 3 Drawing Sheets

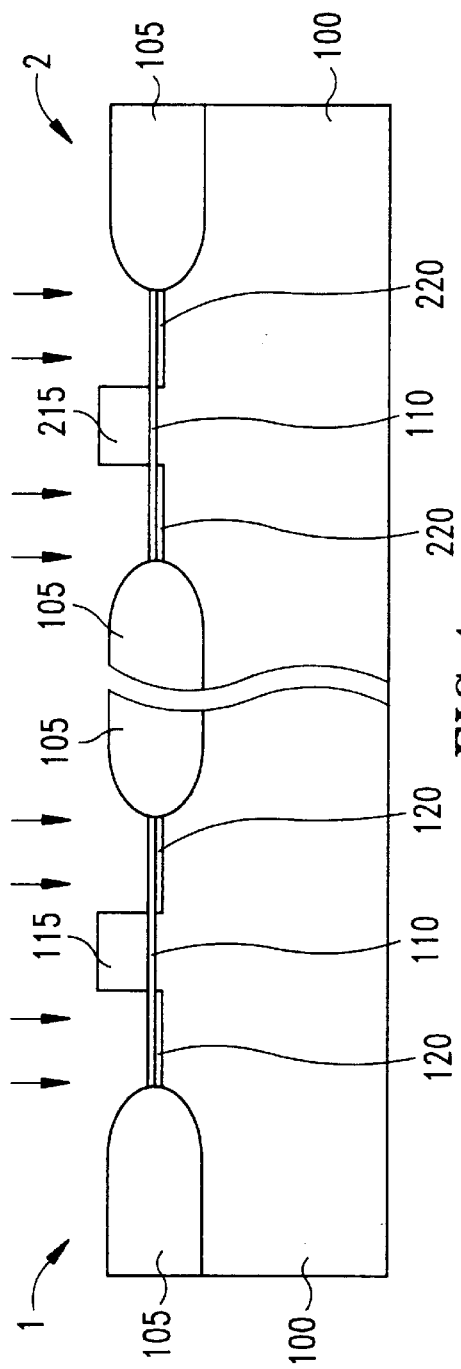
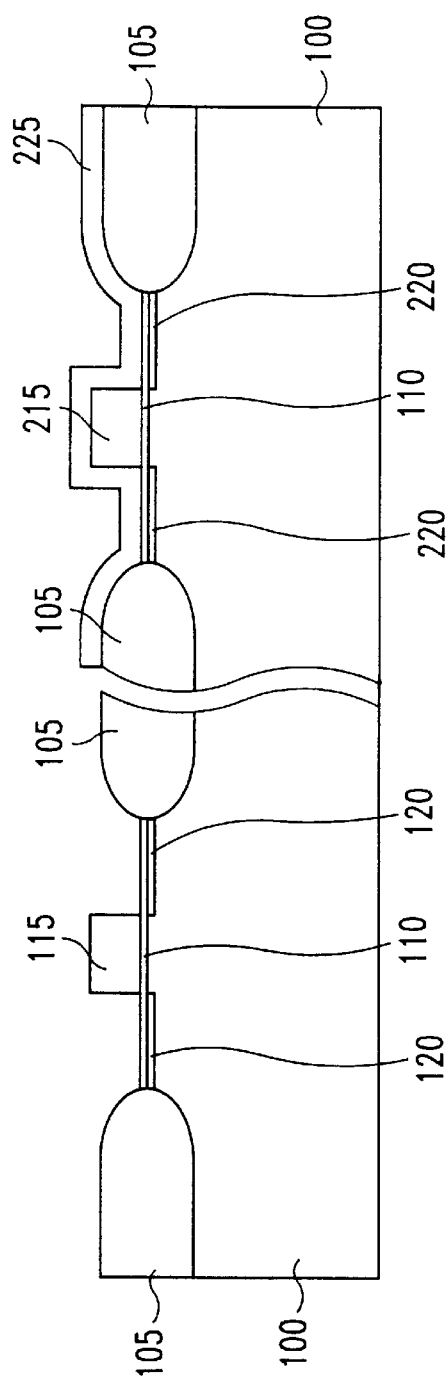

METHOD TO SIMULATANEOUSLY FABRICATE THE SELF-ALIGNED SILICIDED DEVICES AND ESD PROTECTIVE DEVICES

FIELD OF THE INVENTION

The present invention relates to a method of manufacturing the electrostatic discharge (ESD) devices in integrated circuits, and more specifically, to a method of simultaneously manufacturing the silicided devices and the ESD protective devices.

BACKGROUND OF THE INVENTION

In the current technology of integrated circuits, the dimensions of the devices in the integrated circuits are smaller than one-micron meters. In the manufacture of ultra large-scale integrated (ULSI) circuits, the channel's length of transistors is below 0.5 micron meters. The short channel effect often arises in the manufacture of the ULSI circuit. One approach of reducing the short channel effect is a self-aligned silicide (Salicide) of the active region in a transistor. The salicide process can reduce the contact resistance of the ULSI devices and improve the operation speed of the devices. In IEDM Tech. Dig. in the page 73 on 1996, P. Fornara et al. described the application of the salicide process to the short-channel transistors. In this paper, the authors discussed the formation of $TiSi_2$ or $CoSi_2$ on spacers and produced simulating structures of metal films on the spacers. The well-known salicide process is now one of the most efficient ways of obtaining self-aligned low resistive contacts in CMOS and BiCMOS technology. The silicide layers are not formed on spacers of devices and has different topographical results which depend on the materials of the silicide layers.

Salicide processes are used to reduce the contact resistance of the ULSI MOS devices but the devices show worse electrostatic-shielding-devices (ESD) performance than the nob-salicide devices. On page 893 of IEDM Tech. Dig. on 1996, A. Amerasekera et al. discussed the relationship between the salicide thickness on devices and the current gain of the devices. In this paper, the authors concluded that the thicker salicide of the device could degrade the ESD performance of the device and found a phenomena that junction depths and salicide thickness in a 0.25 micron meters CMOS process affect the current gain of a self-biased lateral NPN transistor. The relationship between the current gain and the ESD performance is discussed in this paper. According to this paper, the salicide process can prevent the short-channel effect of the ULSI MOS devices but can degrade the ESD performance of the devices. Devices with lower current gain are found to have lower ESD performance. Current gain is observed to be strongly influenced by the effective drain/source diffusion depth below the silicide which is determined by the implant energy as well as the amount of active diffusion consumed in silicidation.

Therefore, using the salicide process to manufacture the ULSI devices but not influence the ESD performance of the devices is an important topic.

SUMMARY OF THE INVENTION

A method to simultaneously fabricate the self-aligned silicided devices and ESD protective devices is disclosed. A substrate is provided and is a p-type substrate with <100>crystallography orientation. A pad silicon oxide is formed on the substrate. The field oxide region is then formed to define the regions of the functional device and the ESD protective device. Polysilicon gates are defined on the substrate. An N-LDD implantation is then performed on the substrate and lightly doping drains are formed in the devices.

A silicon nitride layer is deposited on the ESD protective device by using conventional chemical vapor deposition (CVD). Spacers of the gate of the functional device are defined and are the insulators of the gate. A refractory metal layer is formed on the functional region. A two-step rapid thermal processing (RTP) anneal is then performed on the substrate. A silicided layer is formed on the active region of the functional device.

After the silicon nitride on the ESD region is stripped, a high-energy ion implantation is performed on the substrate and arsenic ions are implanted into the substrate. A thick silicon oxide is then deposited on the surface of the substrate by using conventional CVD method. Finally, a rapid thermal processing (RTP) anneal is done to form an ultra-shallow junction in the functional device. The device of the self-aligned silicided device with ESD protective region is finished.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional view of a semiconductor substrate illustrating an implanting process of the substrate to fabricate lightly doping drain (LDD) regions in accordance with the present invention;

FIG. 2 is a cross-sectional view of a semiconductor substrate illustrating the formation of a silicon nitride layer which is covered by an electrostatic discharge (ESD) protective region in accordance with the present invention;

DETAILED DESCRIPTION OF THE PREFERRED EMBODIMENT

Figure 3:
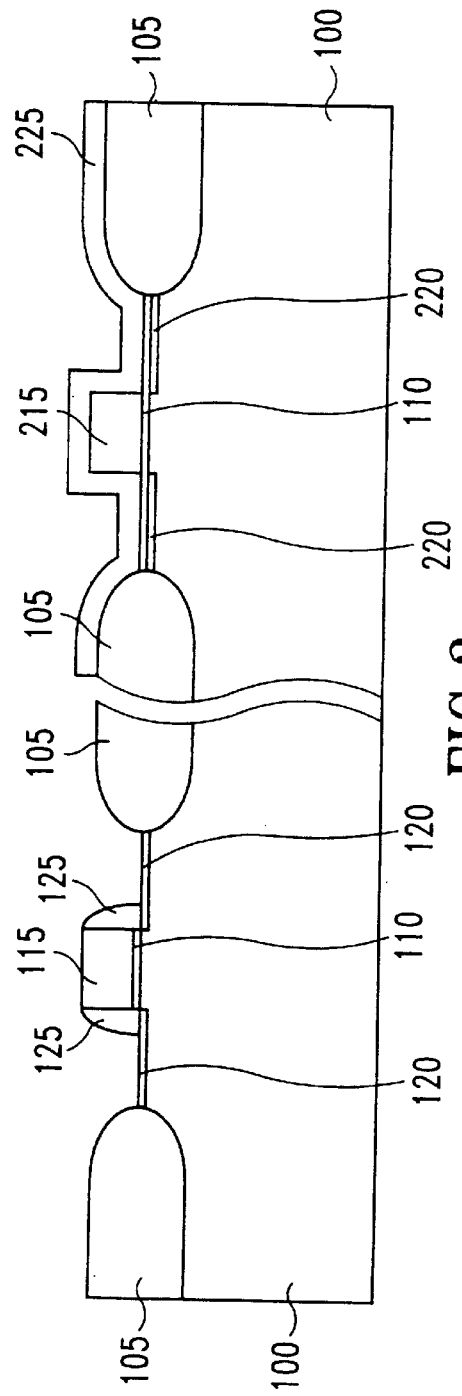
FIG. 3 is a cross-sectional view of a semiconductor substrate illustrating the step of forming spacers to insulate the gate of a functional region in accordance with the present invention.

A method to simultaneously fabricate the self-aligned salicided devices and ESD protective devices is disclosed in the following description.

Referring to FIG. 1, a substrate 100 is provided and the substrate 100 is a p-type substrate with <100> crystallographic orientation. A functional device 1 and an electrostatic discharge (ESD) protective device 2 are on the substrate 100. The devices on the substrate 100 are surrounded by a field oxide (FOX) 105. The FOX 105 is the insulating region between the devices to prevent the electrical-short effect between the devices. Defining the FOX 105 region is the formation of a pad oxide 110 on the substrate 100 and then the deposition of a silicon nitride layer on the pad oxide 110. The FOX 105 region is defined by using lithography and etching technology to remove silicon nitride. The pad oxide 110 can be formed by using a thermal oxidation process or a low pressure chemical vapor deposition (LPCVD) using TEOS as a source at a temperature between about 600° C. to 800° C., at a pressure 0.1 to 10 torrs. A thermal oxidation in an oxygen-steam ambient is used to form the FOX 105 region. The processing temperature of the thermal oxidation process is above 900° C. and the FOX has a thickness of about 3000 to 8000 angstroms.

After the growth of the FOX, the silicon nitride is removed and devices are fabricated on the substrate 100. A polysilicon layer is deposited on the substrate 100 and the gates of the devices are defined by using lithography and etching technology. The gates are the gate 115 of the functional device 1 and the gate 215 of the ESD protective device 2. The pad oxide is the gate oxide of the devices. In the preferred embodiment, the polysilicon layer is deposited by using conventional chemical vapor deposition (CVD) to have a thickness of about 1000 to 5000 angstroms.

Still referring to FIG. 1, after the gate 115 and the gate 215 are formed on the pad oxide 110, the N lightly doping drain (N-LDD) is formed on the substrate 100 and the drain regions of the devices are formed. The drain regions are the active region 120 of the functional device 1 and the drain region 220 of the ESD protective device 2. In the preferred embodiment, the implanting ion of the N-LDD is Phosphorus ion or Arsenic ion and the dosage of the implantation is about $5 \times 10^{12}$ to $5 \times 10^{14}$ ions/cm$^2$.

Referring to FIG. 2, a silicon nitride 225 is deposited on the ESD protective device 2 to protect the ESD region. In the preferred embodiment, the silicon nitride 225 is deposited-by using low-pressure chemical vapor deposition (LPCVD) and is then etched back to remove the silicon nitride on the functional device 1.

Referring to FIG. 3, the oxide spacers 125 of the gate 115 are formed. The formation of the oxide spacers 125 is to deposit a silicon oxide layer on the surface of the functional device 1. The silicon oxide layer is then etched back to form the spacers 125 of the gate 115. The oxide spacers 125 are the isolation of the gate 115. In the preferred embodiment, the method of depositing the silicon oxide of the oxide spacers 125 is a low pressure chemical vapor deposition (LPCVD) and the silicon oxide layer has a thickness of about 30 to 100 angstroms.

Figure 4:
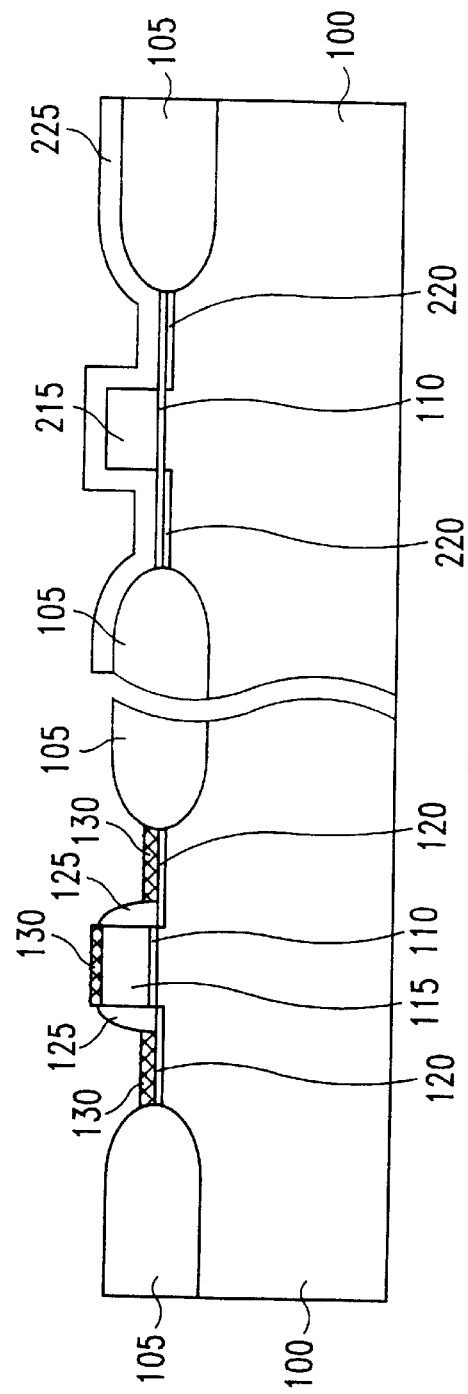
FIG. 4 is a cross-section view of a semiconductor substrate illustrating the step of forming a self-aligned suicide layer on the functional region in accordance with the present invention.

Referring to FIG. 4, the self-aligned silicide layer 130 of the functional device 1 is formed. Firstly, a metal is formed on the surface of the functional device 1. The metals are chosen from the group of metal Titanium Cobalt Tungsten and Platinum, etc. In the preferred embodiment, the metal has a thickness of about 200 to 1000 angstroms. After the metal is deposited or sputtered, the substrate 100 is performed by using two-step rapid thermal processing (RTP) anneal. The silicide layer 130 is formed in a first RTP annealing. After selectively etching and removing the unreacted metal at a room temperature in the mixture of DI H$_2$O, H$_2$O$_2$ and NH$_4$OH, a second RTP annealing is done to lower the silicide layer 130 sheet resistance, and to stabilize the phase of the silicide layer 130. In the preferred embodiment, the processing temperature of the first RTP annealing is about 400° C. to 700° C. and the processing temperature of the second RTP is about 700° C. to 1000°C. The silicide layer 130 covers the surface of the gate 115 and the drain region 120, and forms a low resistance contact of the functional device 1.

Figure 5:
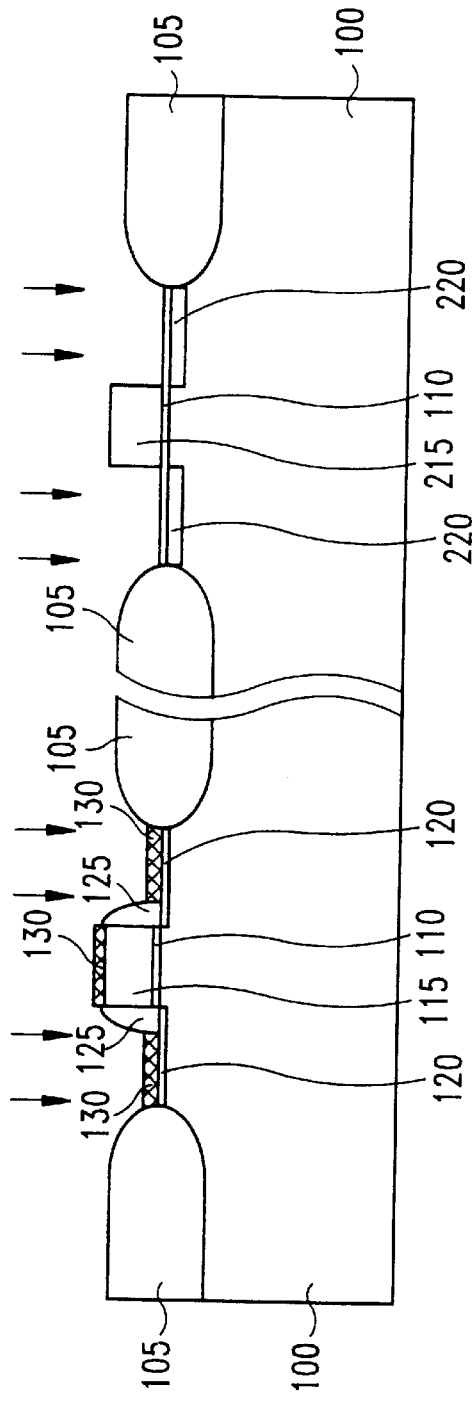
FIG. 5 is a cross-sectional view of a semiconductor substrate illustrating the step of removing the silicon nitride on the protective region and performing an ion implantation on the active region of the devices in accordance with the present invention.

Referring to FIG. 5, after the silicon nitride 225 is removed, a high-energy ion implantation is performed on the substrate 100. The nitride layer 225 can be stripped away by using shot phosphorus acid solution (H$_3$PO$_4$). In the preferred embodiment, the ion which is implanted into the substrate 100 is arsenic ion, the energy[]of the implantation is about 20 to 120 KeV and the dosage of the implantation is about $5 \times 10^{14}$ to $5 \times 10^{16}$ ions/cm$^2$. The active regions 120 of the functional device 1 and the ESD protective device 2 are formed after the ion implantation.

Figure 6:
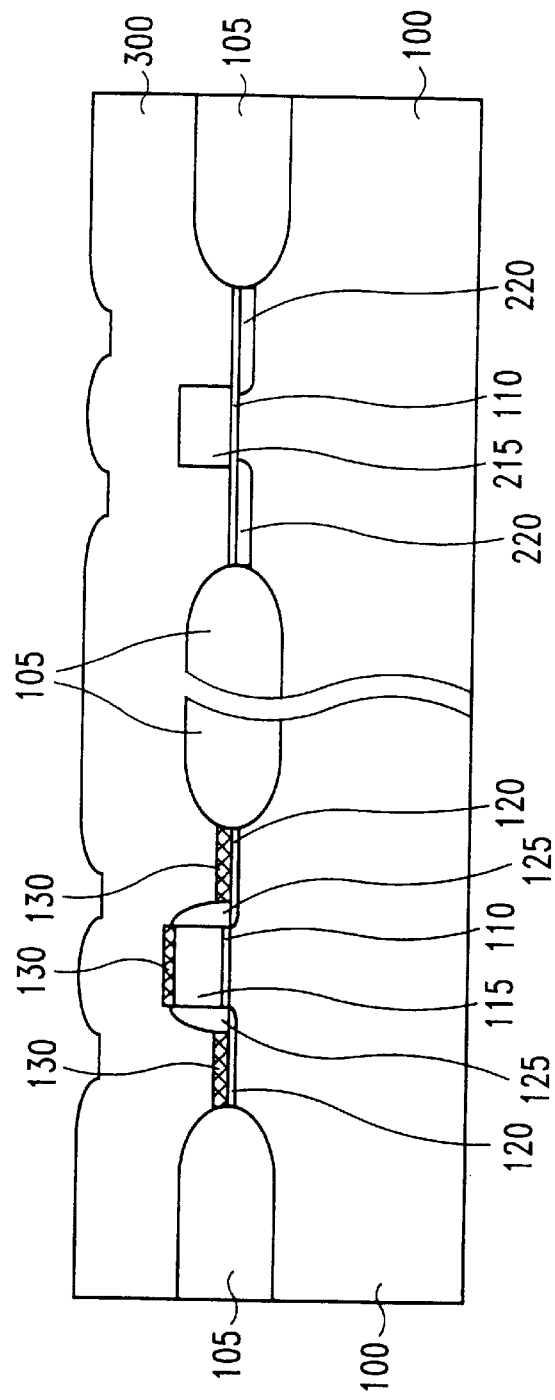
FIG. 6 is a cross-sectional view of a semiconductor substrate illustrating the step of depositing a thick field oxide to cover the surface of the substrate and performing rapid thermal processing (RTP) anneal in accordance with the present invention.

Referring to FIG. 6, a thick silicon oxide 300 is deposited on the substrate 100 and RTP annealing is performed on the substrate 100 to form an ultra-shallow junction of the functional device 1. The thick silicon oxide 300 is deposited with chemical vapor deposition (CVD), using TEOS as a source at a temperature between about 600° C. to 800° C., at a pressure between 0.1 to 10 torrs. The salicide layer 130 is used to be a diffusion source and an ultra-shallow junction is formed in the functional device 1. In the preferred embodiment, the processing temperature of the RTP annealing is about 700° C. to 1150° C.

The high-energy implantation is performed on the substrate 100 and the silicide layer 130 of the functional device 1 is a diffusion source to form the ultra-shallow junction. After RTP annealing, the ultra-shallow junction is formed. The functional device 1 with the ultra-shallow junction has a characteristic for high-speed circuit operation. According to a paper, which was published in IEEE Trans. Electron Devices, vol. ED-43, page 258, on 1996, B. S. Chen et al. described the formation of devices with an ultra-shallow junction. The implantation energy of the ultra-shallow junction is discussed in this paper. The authors of the paper described a fact that increasing the As$_+$ implantation energy will reduces the silicide film degradation and improve the junction characteristics of devices.

Still referring to FIG. 6, a double-diffused drain (DDD) junction is formed in the ESD protective device. The high ESD protective voltage could be obtained by using the double-diffused drain (DDD) junction. In a paper, which was published in EOS/ESD proceedings, on page 212, on 1988, K. L. Chen described the DDD structure of short-channel devices. A fact that DDD structure has a better ESD performance than LDD structure was described in this paper. Thus, DDD structure is used to enhance the ESD performance of short-channel devices in the present invention.

In the present invention, the self-aligned silicided device and ESD protection device are simultaneously fabricated on a substrate. The circuit operation speed could be significantly improved due to the functional device having a self-aligned silicided contact and an ultra-shallow junction. The self-aligned silicided contact has a low contact resistance and a device with the salicided contact has a high operational speed. In the present invention, the ESD protective region are not affected by the salicided layer. Thus the ESD performance is not lowered down. The ultra-shallow junction of the functional device has a low parasitic capacitance in order to increase the speed circuit operation of the functional device. The high ESD protective voltage could be obtained by using the double-diffused drain (DDD) junction.

As is understood by a person skilled in the art, the foregoing preferred embodiment of the present invention are illustrative of the present invention rather than limiting of the present invention.

While the preferred embodiment of the invention has been illustrated and described, it will be appreciated that various changes can be made therein without departing from the spirit and scope of the invention.

What is claimed is:

1. A method to fabricate a self-aligned silicided device, the method comprising the steps of:

providing a substrate having a functional region and an electrostatic discharge (ESD) region, which are isolating by a field oxide , and a pad oxide on a surface of said functional region and said ESD region;

forming gate of said functional region and gate of said ESD region;

forming lightly doping drain (LDD) region on said functional region and said electrostatic discharge (ESD) region;

forming a protective layer to cover said electrostatic discharge (ESD) region;

forming spacers of said gate of said functional region by depositing a silicon oxide layer on said functional region and etching said silicon oxide layer and said pad oxide on said functional region;

forming a self-aligned silicide layer which is on said gate and on said lightly doping drain (LDD) region of said functional region;

removing said protective layer;

performing an ion implantation on said substrate to form active regions of said functional region and said electrostatic discharge (ESD) region;

forming a silicon oxide layer on a surface of said substrate; and performing a thermal anneal on said substrate.

2. The method of claim 1, further comprises following step to form said self-aligned silicide layer:

forming a metal layer on said functional region;

forming a silicide layer on said functional region by using a first rapid thermal processing (RTP) anneal;

removing said metal layer; and performing a second rapid thermal processing (RTP) anneal on said substrate.

3. The method of claim 2, wherein said metal is selected from a group consisting of metal Titanium, Cobalt, Tungsten and Platinum.

4. The method of claim 2, wherein said metal-is removed by using the mixture of DI $H_2O$, $H_2O_2$ and $NH_4OH$.

5. The method of claim 1, wherein ions of said ion implantation comprises arsenic ion, at energy between 20 to 120 keV.

6. The method of claim 1, wherein said thermal anneal is a rapid thermal processing (RTP) anneal.

7. The method of claim 1, wherein said protective layer is formed of silicon nitride.

8. A method to fabricate a self-aligned silicided devices and ESD protection devices, the method comprises the steps of:

providing a semiconductor substrate;

defining a pad oxide and a pad nitride on said substrate;

forming a field oxide to define a functional region and an electrostatic discharge (ESD) region on said substrate;

removing said pad nitride;

forming gates of said functional region and said electrostatic discharge region;

forming lightly doping drains (LDD) in said substrate;

forming a silicon nitride to cover on said electrostatic discharge (ESD) region;

forming spacers of said Rate of said functional region by depositing a silicon oxide layer on said functional region and etching said silicon oxide layer and said pad oxide on said functional region;

forming a metal on said functional region;

performing two-step self-aligned silicided process on said substrate;

removing said metal;

removing said silicon nitride that is on said electrostatic discharge (ESD) region;

performing an ion implantation on said substrate;

forming a thick silicon oxide on said substrate; and performing a thermal anneal on said substrate.

9. The method of claim 8, wherein said refractory metal is selected from a group consisting of metal Titanium, Cobalt, Tungsten, Platinum.

10. The method of claim 8, wherein two-step self-aligned silicided process on said substrate is a two-step rapid thermal processing (RTP) anneal of said substrate.

11. The method of claim 8, wherein said refractory metal is removed by using the mixture of DI $H_2O$, $H_2O_2$ and $NH_4OH$.

12. The method of claim 8, wherein said ion implantation which is performed on said substrate has an energy of about 80 to 120 keV.

13. The method of claim 8, wherein performing a thermal anneal on said substrate is a rapid thermal processing (RTP) anneal.

* * * * *